US011335661B2

(12) United States Patent
Muto et al.

(10) Patent No.: US 11,335,661 B2
(45) Date of Patent: May 17, 2022

(54) WIRE BONDING STRUCTURE

(71) Applicant: Nippon Telegraph and Telephone Corporation, Tokyo (JP)

(72) Inventors: Miwa Muto, Tokyo (JP); Hideaki Matsuzaki, Tokyo (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 0 days.

(21) Appl. No.: 16/970,911

(22) PCT Filed: Feb. 25, 2019

(86) PCT No.: PCT/JP2019/006961
§ 371 (c)(1),
(2) Date: Aug. 18, 2020

(87) PCT Pub. No.: WO2019/181373
PCT Pub. Date: Sep. 26, 2019

(65) Prior Publication Data
US 2020/0395331 A1 Dec. 17, 2020

(30) Foreign Application Priority Data
Mar. 22, 2018 (JP) .............. JP2018-054040

(51) Int. Cl.
H01L 23/00 (2006.01)
H01L 25/065 (2006.01)
H01L 25/00 (2006.01)

(52) U.S. Cl.
CPC .............. *H01L 24/49* (2013.01); *H01L 24/48* (2013.01); *H01L 24/85* (2013.01);
(Continued)

(58) Field of Classification Search
CPC ......... H01L 24/49; H01L 24/48; H01L 23/66; H01L 2224/4917; H01L 24/85; H01L 25/50; H01L 2224/48599; H01L 2224/48464; H01L 2224/48137; H01L 2924/00014; H01L 2924/14; H01L 2924/30111; H01L 2224/48227; H01L 25/0655
See application file for complete search history.

(56) References Cited

U.S. PATENT DOCUMENTS 5,459,284 A * 10/1995 Bockelman ............ H01L 24/49
174/27
5,471,010 A * 11/1995 Bockelman ............ H01L 24/49
174/36
(Continued)

FOREIGN PATENT DOCUMENTS

JP H0758138 3/1995
JP 2007312229 11/2007
JP 2013243209 A1 * 10/2011 ............. H01L 24/06

Primary Examiner — Jasmine J Clark
(74) Attorney, Agent, or Firm — Slater Matsil, LLP

(57) ABSTRACT

A first signal electrode and a second signal electrode are connected by a first wire, a first ground electrode and a fourth ground electrode are connected by a second wire, and a second ground electrode and a third ground electrode are connected by a third wire. The second wire and the third wire cross at only one position above the first wire.

15 Claims, 5 Drawing Sheets

(52) U.S. Cl.
CPC .......... *H01L 25/0655* (2013.01); *H01L 25/50* (2013.01); *H01L 2224/48137* (2013.01); *H01L 2224/48464* (2013.01); *H01L 2224/48599* (2013.01); *H01L 2224/4917* (2013.01); *H01L 2924/30111* (2013.01)

(56) References Cited

U.S. PATENT DOCUMENTS

| | | | | |
|---|---|---|---|---|
| 7,872,325 | B2 * | 1/2011 | Ho | H01L 24/49 257/458 |
| 2005/0189643 | A1 * | 9/2005 | Zhou | H01L 24/49 257/690 |

\* cited by examiner

PRIOR ART

PRIOR ART

WIRE BONDING STRUCTURE

CROSS-REFERENCE TO RELATED APPLICATIONS

This application is a national phase entry of PCT Application No. PCT/JP2019/006961, filed on Feb. 25, 2019, which claims priority to Japanese Application No. 2018-054040 filed on Mar. 22, 2018, which applications are hereby incorporated herein by reference.

TECHNICAL FIELD

The present invention relates to a wire bonding structure for connecting electrodes by using a metal wire.

BACKGROUND

Background Art

As a mounting technique used for a high-frequency module, there is known a wire bonding connection. Wire bonding is a technique using a metal wire to connect between electrodes of an integrated circuit on a substrate and a chip or a semiconductor package. In wire bonding, a gold wire is bonded to an aluminum electrode or a gold terminal by heat, ultrasonic waves, and load. The wire bonding technique is used, for example, to electrically connect the inside and the outside of an integrated circuit chip. Further, the wire bonding technique is sometimes used for connection between an integrated circuit and other electronic components, connection between printed circuit boards, and connection between integrated circuits.

An example of wire bonding connection will be described with reference to FIGS. 3 and 4. To begin with, in the wire bonding structure, a first signal electrode 202, a first ground electrode 203, and a second ground electrode 204 are formed on a first substrate 201. The first ground electrode 203 and the second ground electrode 204 are formed with the first signal electrode 202 interposed therebetween.

Further, a second signal electrode 206, a third ground electrode 207, and a fourth ground electrode 208 are formed on a second substrate 205. The third ground electrode 207 and the fourth ground electrode 208 are formed with the second signal electrode 206 interposed therebetween.

Further, the first signal electrode 202 and the second signal electrode 206 are connected by a first wire 209, the first ground electrode 203 and the third ground electrode 207 are connected by a second wire 210, and the second ground electrode 204 and the fourth ground electrode 208 are connected by a third wire 211.

Note that the first signal electrode 202, the first ground electrode 203, and the second ground electrode 204 are connected to a first integrated circuit chip 212 mounted on the first substrate 201. The first integrated circuit chip 212 is formed on the first substrate 201 via a ground plane 213.

Further, the second signal electrode 206, the third ground electrode 207, and the fourth ground electrode 208 are connected to a second integrated circuit chip 214 mounted on the second substrate 205. The second integrated circuit chip 214 is formed on the second substrate 205 via a ground plane 215. Further, the first substrate 201 is formed on the second substrate 205 via a ground plane 216.

CITATION LIST

Patent Literature [PTL 1] Japanese Patent Application Publication No. H07-058138.

SUMMARY

Technical Problem

It is believed that the above-described wire bonding is a low-cost, highly-flexible connection technique. Accordingly, most of the connections of semiconductor packages and integrated circuits are made by means of wire bonding. However, for a high-frequency module that handles high-frequency signals, it is difficult to match the characteristic impedances at a connection portion using wire bonding, and as a result, there is a problem that a sudden change in impedance in a high-frequency band may cause deterioration of transmission characteristics.

Typically, the terminating resistance of a semiconductor package or an integrated circuit is often set to 50Ω. Therefore, when such a circuit is connected by means of wire bonding, it is desirable that the characteristic impedance of a region to be connected by using a wire is also set to 50Ω. This is because, when a traveling wave applied to a transmission line encounters a surface with discontinuous characteristic impedance, a part (or all) of the traveling wave is reflected. However, it is difficult to reduce a high characteristic impedance value of a wire portion, which leads to deterioration of transmission characteristics.

As a wire bonding technique for reducing such a high characteristic impedance value of a wire portion (signal wire), for example, a technique disclosed in PTL 1 is known. However, in the structure disclosed in PTL 1, a signal wire and a ground wire are fixed to each other by using an adhesive, and the characteristic impedance is controlled by the distance between the wires. This causes a doubt about accuracy and reproducibility. In addition, since a step of bonding the signal wire and the ground wire is required, there is a problem that manufacturing cost and manufacturing time increase.

Embodiments of the present invention has been made to solve the above problems, and an object of embodiments of the invention is to reduce the characteristic impedance in a wire bonding structure for connection of high-frequency signals.

Means for Solving the Problem

A wire bonding structure according to embodiments of the present invention includes a first signal electrode that is formed on a main surface of a first substrate; a first ground electrode and a second ground electrode that are formed on the main surface of the first substrate with the first signal electrode interposed therebetween; a second signal electrode that is formed on a main surface of a second substrate; a third ground electrode and a fourth ground electrode that are formed on the main surface of the second substrate with the second signal electrode interposed therebetween; a first wire that connects the first signal electrode to the second signal electrode; a second wire that connects the first ground electrode and the fourth ground electrode; and a third wire that connects the second ground electrode and the third ground electrode. The second wire and the third wire cross at only one position above the first wire.

In the above wire bonding structure, the main surface of the first substrate and the main surface of the second substrate may be parallel to each other. In addition, an arrangement direction of the first signal electrode, the first ground electrode, and the second ground electrode and an arrangement direction of the second signal electrode, the third ground electrode, and the fourth ground electrode may be parallel to each other.

Effects of Embodiments of the Invention

As described above, according to embodiments of the present invention, since the second wire and the third wire cross above the first wire, there is provided an excellent advantageous effect of reducing the characteristic impedance in the wire bonding structure for connection of high-frequency signals.

DETAILED DESCRIPTION OF ILLUSTRATIVE EMBODIMENTS

Figure 1:
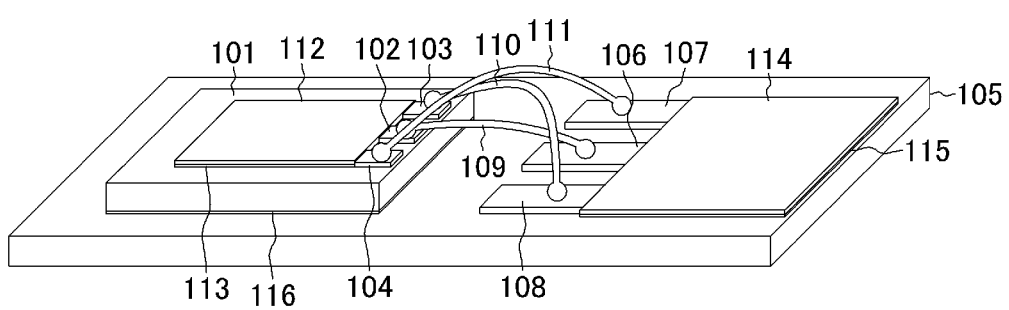
FIG. 1 is a perspective view illustrating a configuration of a wire bonding structure according to an embodiment of the present invention.
Figure 2A:
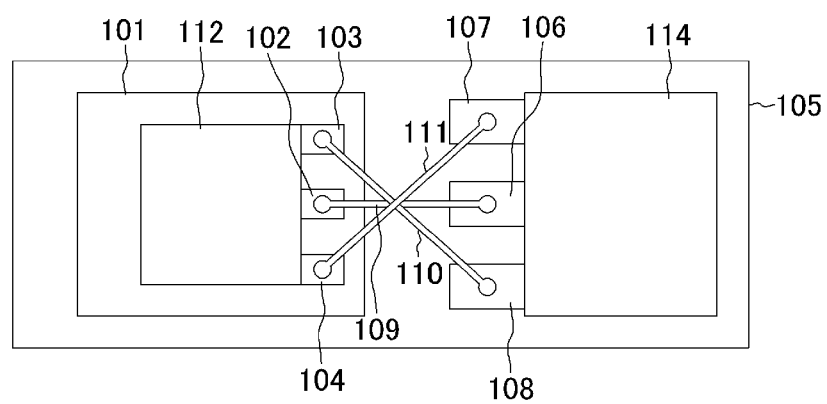
FIG. 2A is a plan view illustrating the configuration of the wire bonding structure according to the embodiment of the present invention.
Figure 2B:
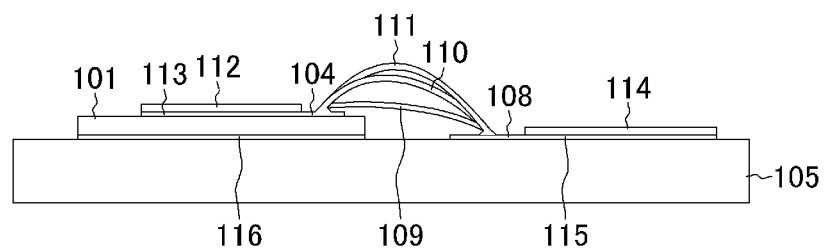
FIG. 2B is a side view illustrating the configuration of the wire bonding structure according to the embodiment of the present invention.

Hereinafter, a wire bonding structure according to an embodiment of the present invention will be described with reference to FIGS. 1, 2A, and 2B.

To begin with, a first signal electrode 102, a first ground electrode 103, and a second ground electrode 104 are formed on a main surface of a first substrate 101. The first ground electrode 103 and the second ground electrode 104 are formed with the first signal electrode 102 interposed therebetween.

Further, a second signal electrode 106, a third ground electrode 107, and a fourth ground electrode 108 are formed on a main surface of a second substrate 105. The third ground electrode 107 and the fourth ground electrode 108 are formed with the second signal electrode 106 interposed therebetween.

Further, the first signal electrode 102 and the second signal electrode 106 are connected by a first wire 109. Further, the first ground electrode 103 and the fourth ground electrode 108 are connected by a second wire 110. Further, the second ground electrode 104 and the third ground electrode 107 are connected by a third wire 111. The first wire 109 is a signal wire, and the second wire 110 and the third wire 111 are ground wires. Each wire is made of, for example, gold (Au) and is formed by means of a known wire bonding technique.

In the above-described configuration, in the embodiment, the second wire 110 and the third wire 111 cross at only one position above the first wire 109. Note that the second wire 110 and the third wire 11 may come into contact at the cross point. Here, the first ground electrode 103 and a third ground electrode 107 are arranged on one side of a virtual straight line connecting the first signal electrode 102 and the second signal electrode 106. Further, the second ground electrode 104 and the fourth ground electrode 108 are arranged on the other side of a virtual straight line connecting the first signal electrode 102 and the second signal electrode 106. In this state, when the first ground electrode 103 and the fourth ground electrode 108 are connected by the second wire 110, and the second ground electrode 104 and the third ground electrode 107 are connected by the third wire in, the second wire 110 and the third wire 111 cross at only one position above the first wire 109.

Note that, in the embodiment, the main surface of the first substrate 101 and the main surface of the second substrate 105 are parallel to each other. In addition, an arrangement direction of the first signal electrode 102, the first ground electrode 103, and the second ground electrode 104 and an arrangement direction of the second signal electrode 106, the third ground electrode 107, and the fourth ground electrode 108 are parallel to each other.

Here, in the embodiment, the first signal electrode 102, the first ground electrode 103, and the second ground electrode 104 are connected to a first integrated circuit chip 112 formed (mounted) on the first substrate 101. The first integrated circuit chip 112 is formed on the first substrate 101 via a ground plane 113.

Further, the second signal electrode 106, the third ground electrode 107, and the fourth ground electrode 108 are connected to a second integrated circuit chip 114 formed (mounted) on the second substrate 105. The second integrated circuit chip 114 is formed on the second substrate 105 via a ground plane 115. Further, the first substrate 101 is formed on the second substrate 105 via a ground plane 116.

Figure 3:
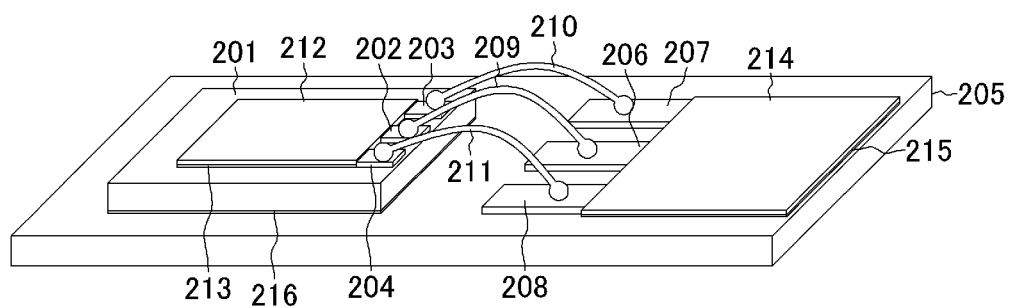
FIG. 3 is a perspective view illustrating a configuration of a conventional wire bonding structure.
Figure 4:
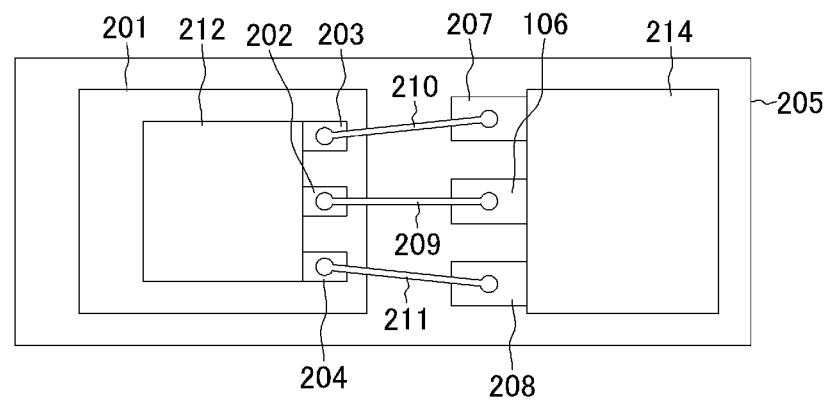
FIG. 4 is a plan view illustrating the configuration of the conventional wire bonding structure.

According to the wire bonding structure in the above-described embodiment, the distance between the first wire 109 and each of the second wire 110 and the third wire 11 can be made smaller than in the conventional structure art described with reference to FIGS. 3 and 4. As a result, according to the embodiment, the characteristic impedance of the first wire 109 serving as a signal line can be reduced.

Typically, the distance between electrodes in a semiconductor package on which an integrated circuit chip is mounted is on the order of several millimeters, and the distance (interval) between a signal wire and a ground wire is also a similar value. However, according to the embodiment, since the second wire 110 and the third wire 111 cross above the first wire 109, the distance (interval) between the signal wire and the ground wire can have a value of about several tens of micrometers. In addition, the distance between the signal wire and the ground wire gradually decreases to the midpoint between the first signal electrode 102 and the second signal electrode 106. Accordingly, a sudden change in the characteristic impedance hardly occurs, and as a result, the structure of embodiments of the present invention makes it hard to deteriorate the characteristic impedance. Note that the above-mentioned distance becomes minimum when the second wire 110 and the third wire 111 are directly above the first wire 109. Therefore, according to the embodiment, it is possible to suppress a sudden change in the characteristic impedance at a connection portion using a wire, and thus to connect high-frequency signals with low loss.

Note that the above description is for an example of the so-called GSG structure in which a signal electrode (S) and ground electrodes (G) are alternately arranged, but the present invention is not limited to this. For example, embodiments of the present invention are similarly applicable to a multi-lane structure in which two signal lines or three or more signal lines are connected to one electrode in a GSGSG structure.

As described above, according to the present invention, since the second wire and the third wire which serve serving as ground wires, cross above the first wire which serves as a signal wire, it is possible to reduce the characteristic impedance in the wire bonding structure for connection of high-frequency signals.

Since all of metals, dielectrics, and magnetic materials around a portion where a signal flows affect the storage of electromagnetic energy, all of which affect the characteristic impedance. In other words, a change in the physical arrangement around a signal wire leads to a change in the characteristic impedance of the signal wire. If there is nothing around the wire, the characteristic impedance of the signal wire depends on the distance from a ground wire.

In the structure of the present invention, the signal wire is formed on a straight line as much as possible to make the distance short, and the ground wires cross above the signal wire. With this configuration, the distance between the signal wire and each ground wire can be made smaller than in the conventional structure, and thus it is possible to reduce the characteristic impedance of the signal wire.

The wire bonding structure according to embodiments of the present invention does not require a new additional configuration for the manufacturing process of the conventional wire bonding structure, but only crosses two ground wires for bonding.

Note that the present invention is not limited to the above-described embodiment, and it is obvious that many modifications and combinations can be made by those skilled in the art without departing from the technical concept of the invention. For example, in the above-described embodiment, a connection between the integrated circuits on the substrate is exemplified, and however, the present structure is applicable to all uses for electrical bonding such as a connection between an integrated circuit and other electronic components, a connection between printed boards, and the like.

REFERENCE SIGNS LIST

101 First substrate
102 First signal electrode
103 First ground electrode
104 Second ground electrode
105 Second substrate
106 Second signal electrode
107 Third ground electrode
108 Fourth ground electrode
109 First wire
110 Second wire
111 Third wire
112 First integrated circuit chip
113 Ground plane
114 Second integrated circuit chip
115 Ground plane
116 Ground plane.

The invention claimed is:

1. A wire bonding structure comprising:
a first signal electrode on a surface of a first substrate;
a first ground electrode and a second ground electrode on the surface of the first substrate, wherein the first signal electrode is between the first ground electrode and the second ground electrode;
a second signal electrode on a surface of a second substrate;
a third ground electrode and a fourth ground electrode on the surface of the second substrate, wherein the second signal electrode is between the third ground electrode and the fourth ground electrode;
a first wire connecting the first signal electrode to the second signal electrode;
a second wire connecting the first ground electrode and the fourth ground electrode; and
a third wire connecting the second ground electrode and the third ground electrode, wherein the second wire crosses to another side of the third wire only at a first position, and wherein the first position is above the first wire.

2. The wire bonding structure according to claim 1, wherein the surface of the first substrate and the surface of the second substrate are parallel to each other.

3. The wire bonding structure according to claim 1, wherein the first signal electrode, the first ground electrode, and the second ground electrode are arranged in a first row along a first direction, wherein the second signal electrode, the third ground electrode, and the fourth ground electrode are arranged in a second row along a second direction, and wherein the first direction is parallel to the second direction.

4. The wire bonding structure of claim 1, wherein the surface of the first substrate is higher than the surface of the second substrate.

5. The wire bonding structure of claim 4, wherein the first substrate is mounted on the surface of the second substrate.

6. The wire bonding structure of claim 5 further comprising a third ground plane between the first substrate and the surface of the second substrate.

7. The wire bonding structure of claim 1 further comprising a first integrated circuit chip mounted on the surface of the first substrate.

8. The wire bonding structure of claim 7 further comprising a first ground plane between the first integrated circuit chip and the surface of the first substrate.

9. The wire bonding structure of claim 1 further comprising a second integrated circuit chip mounted on the surface of the second substrate.

10. The wire bonding structure of claim 9 further comprising a second ground plane between the second integrated circuit chip and the surface of the second substrate.

11. A method comprising:
providing a first substrate, wherein a first signal electrode, a first ground electrode, and a second ground electrode are disposed on a surface of a first substrate, and wherein the first signal electrode is between the first ground electrode and the second ground electrode;
providing a second substrate, wherein a second signal electrode, a third ground electrode, and a fourth ground electrode are disposed on a surface of a second substrate, wherein the second signal electrode is between the third ground electrode and the fourth ground electrode;
connecting the first signal electrode to the second signal electrode using a first wire;
connecting the first ground electrode to the fourth ground electrode using a second wire; and
connecting the second ground electrode to the third ground electrode using a third wire wherein the second wire crosses to another side of the third wire only at a first position, and wherein the first position is above the first wire.

12. The method according to claim 11, wherein the surface of the first substrate and the surface of the second substrate are parallel to each other.

13. The method according to claim 11, wherein the first signal electrode, the first ground electrode, and the second ground electrode are arranged in a first row along a first direction, wherein the second signal electrode, the third ground electrode, and the fourth ground electrode are arranged in a second row along a second direction, and wherein the first direction is parallel to the second direction.

14. The method according to claim 11, wherein the surface of the first substrate is higher than the surface of the second substrate.

15. The method according to claim 14 further comprising mounting the first substrate to the surface of the second substrate.

* * * * *